US 6,549,132 B2

(12) United States Patent
Parrotta et al.

(10) Patent No.: US 6,549,132 B2
(45) Date of Patent: Apr. 15, 2003

(54) DEACTIVATABLE ELECTRONIC ARTICLE SURVEILLANCE TAG AND METHOD FOR MAKING SAME

(75) Inventors: Michael A. Parrotta, Churchville, PA (US); Robert L. Flowers, Coatesville, PA (US)

(73) Assignee: Westvaco Packaging Group, Inc., New York, NY (US)

( * ) Notice: Subject to any disclaimer, the term of this patent is extended or adjusted under 35 U.S.C. 154(b) by 0 days.

(21) Appl. No.: 10/025,439

(22) Filed: Dec. 19, 2001

(65) Prior Publication Data

US 2002/0050929 A1 May 2, 2002

Related U.S. Application Data

(63) Continuation-in-part of application No. 09/597,361, filed on Jun. 19, 2000, now abandoned.
(51) Int. Cl.[7] ............................................... G08B 13/14
(52) U.S. Cl. ................................................... 340/572.1
(58) Field of Search .......................... 340/572.1, 572.2, 340/572.3, 572.5; 428/209, 457, 461

(56) References Cited

U.S. PATENT DOCUMENTS

| 4,567,473 | A | * | 1/1986 | Lichtblau | 340/572 |
| 4,578,654 | A | * | 3/1986 | Tait | 333/175 |
| 4,818,312 | A | * | 4/1989 | Benge | 156/52 |
| 5,012,225 | A | * | 4/1991 | Gill | 340/572 |
| 5,059,950 | A | * | 10/1991 | Perchak | 340/572 |
| 5,187,466 | A | * | 2/1993 | Pichl | 340/572 |
| 5,367,290 | A | * | 11/1994 | Kind et al. | 340/572 |

* cited by examiner

Primary Examiner—Daniel J. Wu
Assistant Examiner—Tai T. Nguyen
(74) Attorney, Agent, or Firm—Priest & Goldstein, PLLC (57) ABSTRACT

An electronic article surveillance tag is described, in which a resonant circuit tuned to be detectable by a sensor is fabricated onto the upper and lower surfaces of a dielectric substrate. The dielectric substrate includes a membrane that provides insulation between a first circuit component fabricated onto the upper surface of the dielectric substrate and a second circuit component fabricated onto the lower surface of the dielectric substrate. When a deactivation voltage is applied across the electronic article surveillance tag, the membrane fails, causing the resonant circuit to become detuned.

45 Claims, 11 Drawing Sheets

DEACTIVATABLE ELECTRONIC ARTICLE SURVEILLANCE TAG AND METHOD FOR MAKING SAME

This application is a continuation-in-part of U.S. patent application Ser. No. 09/597,361, filed Jun. 19, 2000, now abandoned, and assigned to the assignee of the present application, the disclosure and drawings of which are hereby incorporated by reference in their entirety.

BACKGROUND OF THE INVENTION

The present invention relates generally to improvements in electronic article surveillance (EAS) tags, and particularly to advantageous aspects of a deactivatable EAS tag and methods for manufacturing a deactivatable EAS tag.

Generally speaking, it is desirable for an EAS tag to be readily deactivatable by store personnel. However, deactivatability adds to the cost of the tag. Because EAS tags are typically manufactured and used in extremely high volume, the savings of even a fraction of a penny per unit in the manufacturing process may be significant.

SUMMARY OF THE INVENTION

An aspect of the invention provides an electronic article surveillance tag in which a resonant circuit that is tuned to be detectable by a sensor is fabricated onto the upper and lower surfaces of a dielectric substrate. The dielectric substrate includes a membrane positioned between a first circuit component fabricated onto the upper surface of the dielectric substrate and a second circuit component fabricated onto the lower surface of the dielectric substrate. The membrane provides insulation between the first and second circuit components. When a deactivation voltage is applied across the electronic article surveillance tag, the membrane fails, causing the resonant circuit to become detuned.

Additional features and advantages of the present invention will become apparent by reference to the following detailed description and accompanying drawings.

BRIEF DESCRIPTION OF THE DRAWINGS

FIGS. 8A and 8B show, respectively, top and front elevation views of the dielectric substrate shown in FIGS. 7A and 7B, with a first circuit component layer fabricated thereon.

DETAILED DESCRIPTION

As used herein, the term "membrane" refers to a piece of dielectric material that is positioned between electrical components in a circuit in an EAS tag, providing insulation therebetween, and that is designed to fail when a requisite voltage, herein referred to as a "deactivation voltage" is applied across the EAS tag. As described below, a membrane may be formed using a variety of techniques, including an acid-etch technique and high-speed printing technique. The choice of technique used to form a membrane depends on a number of factors, including the materials used to fabricate the EAS tag.

As used herein, the term "high-speed printing technique" includes serigraphic or screen, flexographic, gravure, letterpress, and lithographic printing methods, as well as inkjet, laserjet, xerographic techniques, and the like.

Figure 1:
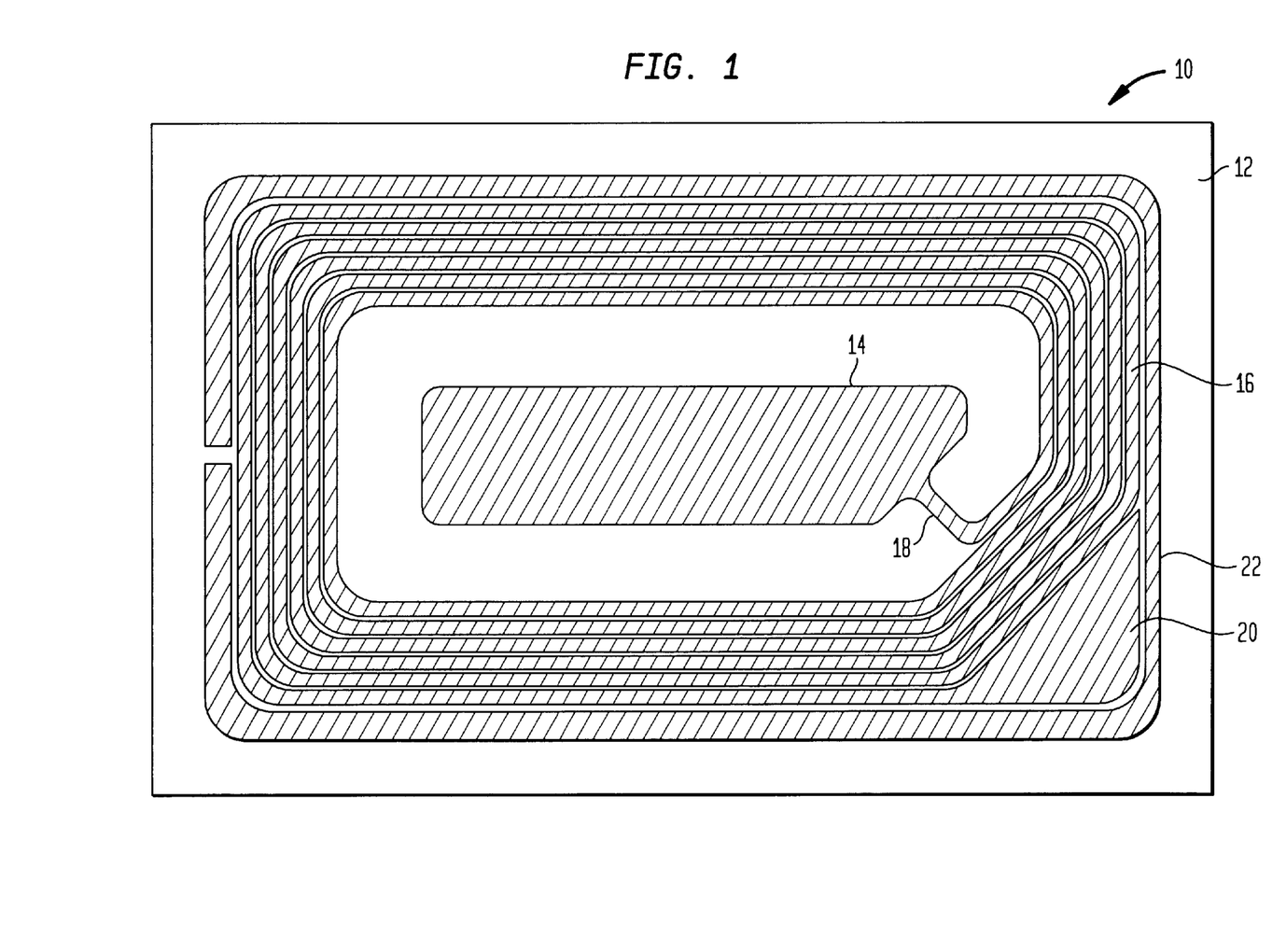
FIG. 1 shows a top view of the interior of an EAS tag according to a first aspect of the invention.

FIG. 1 shows a plan view of an EAS tag 10 according to an aspect of the invention. In the EAS tag 10 shown in FIG. 1, resonant circuit components are fabricated on either side of a dielectric substrate 12. The substrate 12 may be plastic, paper, or other material with suitable dielectric properties. Fabricated onto a first surface of the substrate 12 are a first electrode 14 and an inductor 16. A desired inductance for the inductor 16 can be achieved by adjusting a number of parameters, including the size, shape, and thickness of the inductor 16, as well as the material used to fabricate the inductor 16. As shown in FIG. 1, a conductive path 18 is provided to connect the electrode 14 to the inductor 16. As further shown in FIG. 1, the inductor 16 terminates in a connector 20 which, as described below, is used to connect the circuit components on the upper surface of the substrate 12 to circuit components on the bottom surface of the substrate 12. Finally, an open loop 22 surrounds the other electrical components, and provides electromagnetic shielding.

Figure 2:
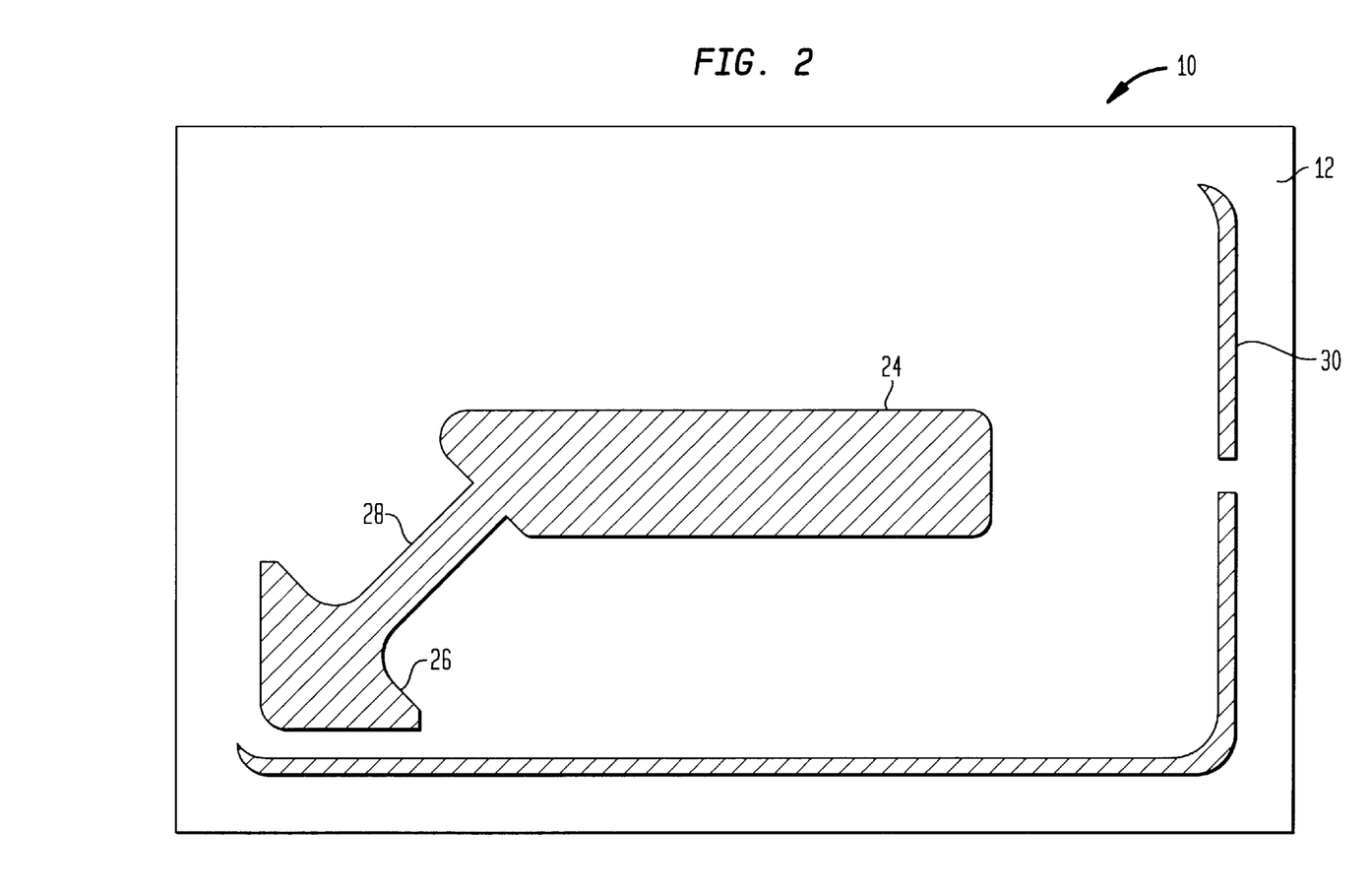
FIG. 2 shows a bottom view of the EAS tag interior shown in FIG. 1.

FIG. 2 shows a bottom view of the EAS tag 10 shown in FIG. 1. As shown in FIG. 2, the bottom surface of the EAS tag 10 includes a second electrode 24 that corresponds in shape and size to the first electrode 14 fabricated onto the top surface of the EAS tag 10. The first and second electrodes 14 and 24 are positioned on the substrate 12 such that the first electrode 14 lies on top of the second electrode 24, separated by the substrate 12, to form a capacitor. A desired capacitance for the capacitor formed by the first and second electrodes 14 and 24 can be achieved by manipulating various parameters, including the choice of materials used to fabricate the dielectric substrate 12 and the electrodes 14 and 24, as well as the thickness of the substrate 12 and the size, shape and thickness of the electrodes 14 and 24.

The bottom surface of the substrate 12 further includes a second connector 26 that corresponds in position to the first connector 20 on the upper surface of the substrate 12. It will be seen that the two connectors 20 and 26 line up with each other so that the first connector 20 lies on top of the second connector 26. As mentioned above, the two connectors 20 and 26 are used to create an electrical connection between the circuit components on either surface of the substrate 12. One technique for creating the electrical connection is to use a cutting or punching device to cause portions of the first connector 20 to extend through the substrate 12 to make electrical contact with the second connector 26. A second technique is to cut, or otherwise fabricate, a suitably positioned opening in the substrate 12 prior to the fabrication of the electrical components onto the substrate 12.

As further shown in FIG. 2, there is provided a conductive pathway 28 between the second electrode 24 and the second connector 26. There is further provided a broken L-shaped member 30, corresponding in position to two sides of the rectangular loop 22 on the upper surface of the substrate 12. The L-shaped member 30 provides electromagnetic shielding.

The inductor 16 on the upper surface of the substrate 12 and the capacitor formed by electrodes 14 and 24 on the upper and lower surfaces of the substrate 12 are connected together to form a resonant circuit. The values for the inductor 16 and the capacitor formed by electrodes 14 and 24 are chosen so that the resonant circuit is tuned to have a characteristic resonant frequency that is detectable by an EAS sensor. If the resonant circuit is detuned, then the EAS tag is no longer detectable by the EAS sensor.

As described below, according to an aspect of the invention, the dielectric substrate 12 includes a membrane 32 between electrodes 14 and 24. When a deactivation voltage is applied across the EAS tag, the membrane fails, resulting in a short circuit across the capacitor. The short circuit causes the resonant circuit to become detuned. Once the resonant circuit is detuned, the EAS tag is no longer detectable by an EAS sensor. One technique that can be used to form the membrane 32 is an acid etching technique, described below. If an acid etching technique is used, then the choice of material for the substrate 12 is limited to materials suitable for acid etching. However, it will be appreciated that the present invention is not limited solely to EAS tags fabricated using an acid etching technique.

Figure 3:
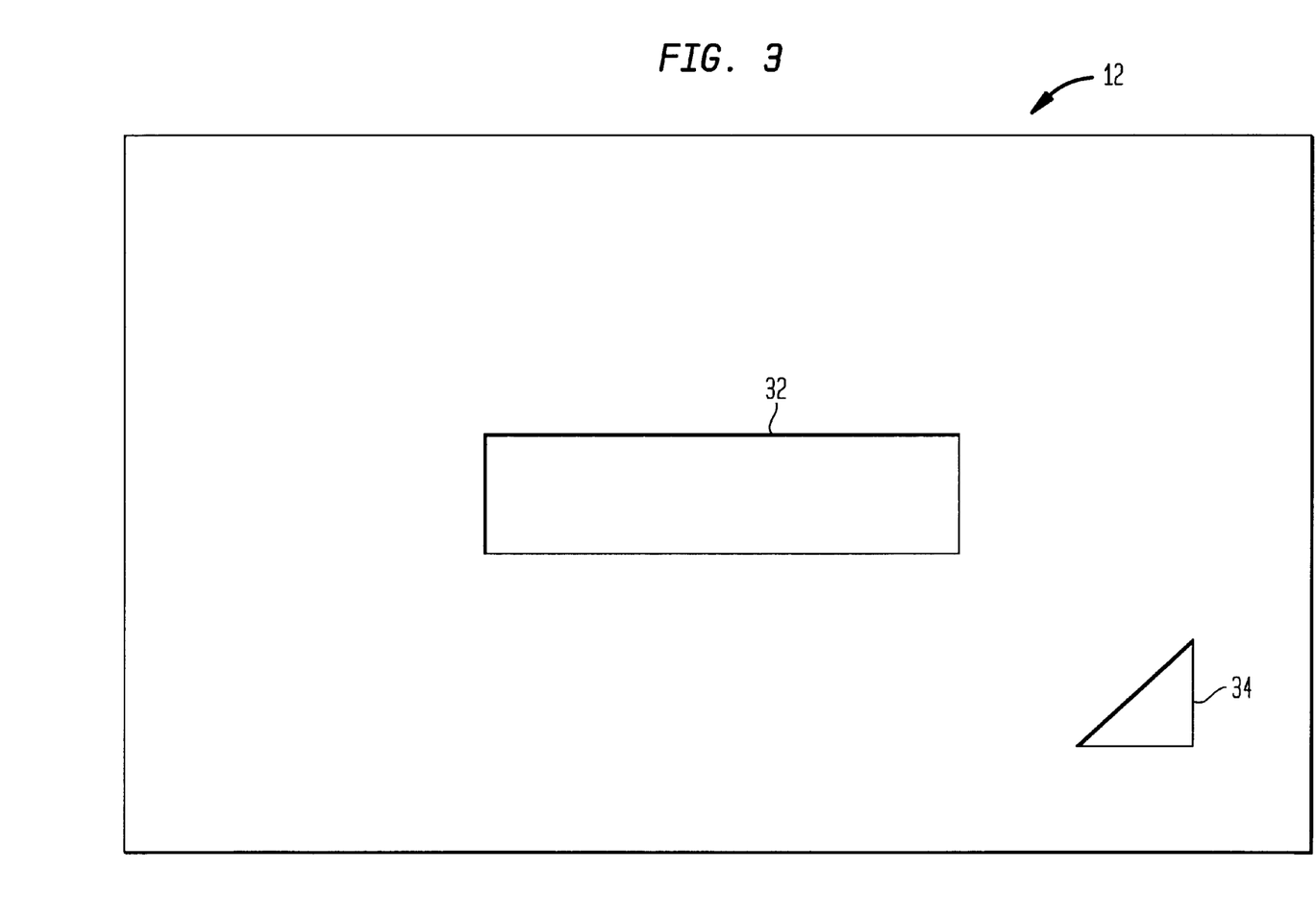
FIG. 3 shows a top view of a dielectric substrate suitable for use in fabricating the EAS tag interior shown in FIG. 1.

FIG. 3 shows a top view of the substrate 12 shown in FIG. 1, before any electrical components have been fabricated thereon. At the center of the substrate is a membrane 32 located between the electrodes 14 and 24 of the capacitor in the finished circuit. As described in further detail below, according to an aspect of the invention, the membrane 32 is a portion of the substrate 12 that has been thinned such that it maintains its insulative properties, but such that when a deactivation voltage is applied to the finished EAS tag, the membrane 32 fails, causing a short circuit to develop across the capacitor electrodes 14 and 24, thereby detuning the resonant circuit, and causing the EAS tag to become undetectable by a security detector.

FIG. 3 further shows a triangular connector region 34 in the lower right corner of the substrate corresponding to the connectors 20 and 26 fabricated onto the upper and lower surfaces of the substrate 12. As mentioned above, one technique for providing an electrical connection between the upper and lower connectors 20 and 26 is to punch or cut a portion of a connector such that portions of the connector extend through the connector region 34 to make electrical contact with the other connector. Another way to create an electrical connection is to fabricate an opening or openings in the substrate 12 in the triangular connector region 34, such that when the connectors 20 and 26 are fabricated on either side of the substrate 12, portions of the electrical components 20 and 26 make contact through the opening or openings.

Figure 4:
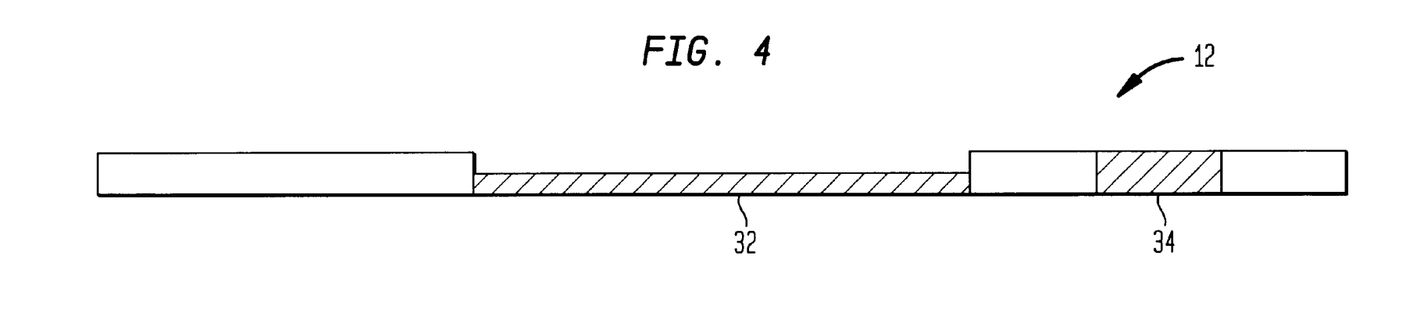
FIG. 4 shows a front elevation view of the dielectric substrate shown in FIG. 3.

FIG. 4 shows a side view of the substrate 12 shown in FIG. 3. As illustrated in FIG. 4, the membrane 32 is formed in a central region of the substrate 12. The thickness of the membrane 32 is chosen such that there is sufficient insulation between the first and second electrodes 14 and 24 to provide a desired capacitance, but thin enough so that the membrane 32 will fail when exposed to an electric field of sufficient strength.

According to a further aspect of the invention, the membrane 32 is formed by using an acid etching technique to eat away a portion of the substrate 12. A high-speed printing technique, such as serigraphic or screen printing, may be used to implement the acid etching technique. If a screen printing technique is used, a suitable printing screen is created out of an acid-resistant material, such as ceramic, or epoxy-coated stainless steel mesh. The screen is then used to print a viscous acid solution onto a dielectric substrate. The printed acid solution is allowed to remain on the substrate a sufficient amount of time for a suitable membrane to be formed. At this point, the acid solution is washed off the substrate. The washing solution may be plain water, or may also contain a mild base or other suitable acid neutralizer.

Suitable materials for the dielectric substrate 12 include: polyester, polyvinyl chloride (PVC), polypropylene, polyethylene terephthalate glycol (PETG), polyethylene, and polyvinylidene chloride (PVDC). Suitable acids include: hydrochloric acid (HCl), sulfuric acid ($H_2SO_4$), and phosphoric acid $H_3PO_4$. In order to prepare a viscous acid solution suitable for printing, the acid is diluted with water to a pH of 3.0 or lower. A thickening agent is then added to the acid solution to achieve a viscosity in the range of 150 to 200 centipoise. A cellulosic thickener may suitably be used, such as carboxymethyl cellulose. Another suitable thickener is polyacrylate. Suitable thickeners are sold under the trademark ALCOGUM®. The thickness of the membrane 32 formed depends on a number of different factors, including the choice of substrate material and acid solution, as well as the amount of time the acid solution remains on the substrate 12 before it is washed off.

Figure 5:
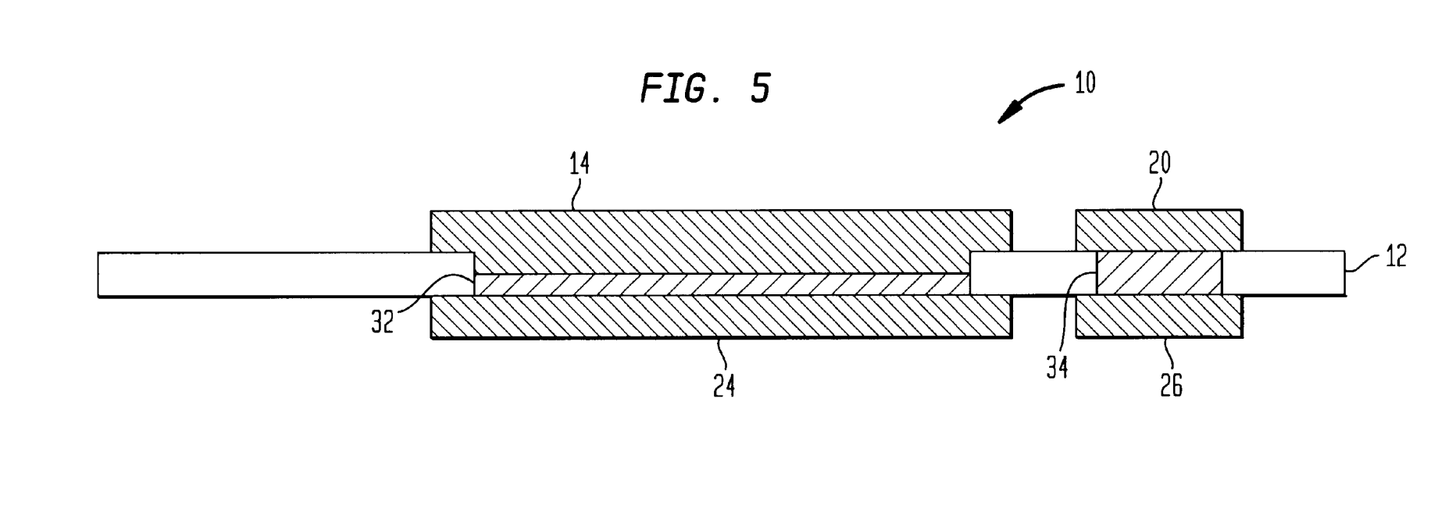
FIG. 5 shows a front elevation view of the dielectric substrate shown in FIG. 3, with electrical components fabricated onto its upper and lower surfaces.

Once the membrane 32 has been formed, circuit components are then fabricated onto either side of the substrate 12. FIG. 5 shows a side view of the substrate 12 shown in FIG. 4, with capacitor electrodes 20 and 26 fabricated onto the upper and lower surfaces of the substrate 12. After the circuit components have been fabricated onto the upper and lower surfaces of the substrate 12, the circuit components may be covered with a protective, insulative coating that can be applied using printing or coating techniques, or may also be applied in the form of additional sheets of dielectric material. Further, an adhesive layer may be applied to the EAS tag to allow the EAS tag to be affixed to a receiving surface on a retail item or retail packaging. Multiple EAS tags can be manufactured onto a sheet or roll of dielectric material, and then separated into individual tags.

Figure 6:
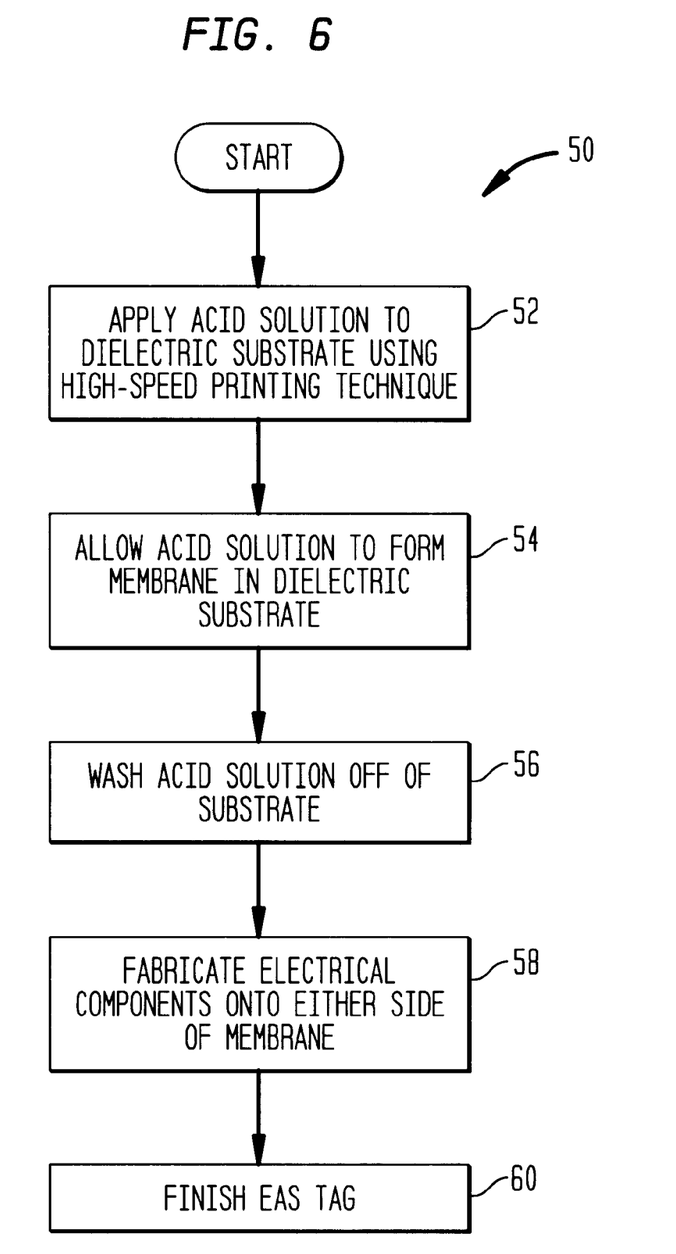
FIG. 6 shows a flowchart of a method according to a further aspect of the invention.

FIG. 6 shows a flowchart of a method 50 for manufacturing an EAS tag according to a further aspect of the invention. In step 52, an acid solution is applied to a dielectric substrate using a high-speed printing technique. In step 54, the acid solution is allowed to form a membrane in the dielectric substrate. In step 56, when the acid solution has eaten away a sufficient amount of the dielectric substrate to form a membrane of the desired thickness, the acid solution is washed off the substrate. As discussed above, the washing solution may include an acid neutralizer. In step 58, electrical components are fabricated onto either side of the membrane. In step 60, the EAS tag is finished. The finishing process may include applying any desired protective coatings or layers over the electrical components and applying an adhesive backing to the EAS tag. Also, if a plurality of EAS tags have been manufactured onto a sheet or roll, the finishing process may include separating individual EAS tags from the sheet or roll.

In addition to the acid-etching technique described above, a further aspect of the invention provides another technique for creating a membrane in an EAS tag using high-speed printing techniques. According to this aspect of the invention, a resonant circuit is fabricated by printing successive layers of conductive ink and dielectric material onto a substrate. The conductive ink is used to fabricate the electrical components of the circuit, and the dielectric material provides insulation. As described in further detail below, the dielectric material is printed such that a membrane is fabricated between electrical components. When the EAS tag is exposed to a sufficiently high electrical voltage, the membrane fails, causing a short circuit and thereby detuning the circuit.

Figures 7A, 7B:
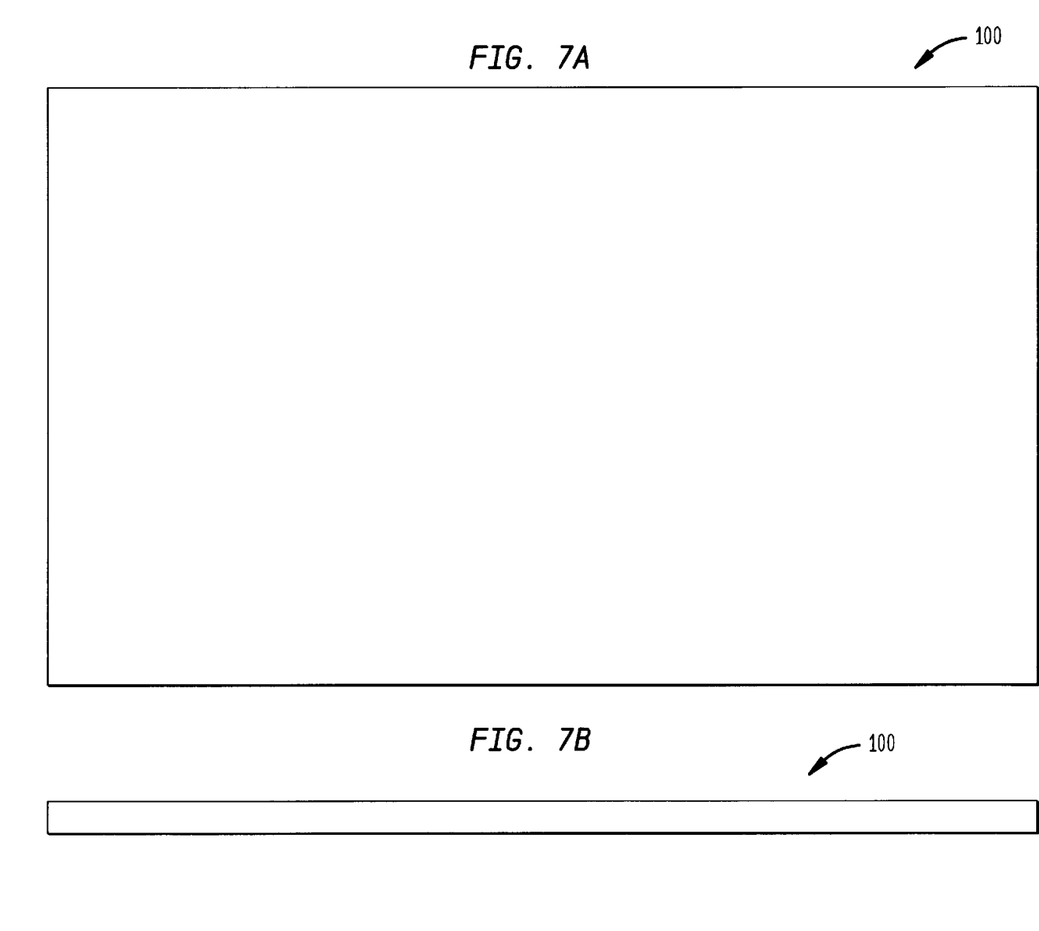
FIGS. 7A and 7B show, respectively, top and front elevation views of a dielectric substrate according to a further aspect of the invention.

FIG. 7A shows a top view and FIG. 7B shows a side view of a dielectric substrate 100 upon which a resonant circuit can be fabricated according to an aspect of the present invention. The dielectric substrate may be a portion of a larger sheet or roll of a material with suitable dielectric and structural properties. A suitable dielectric substrate may be selected from materials currently used to fabricate product packaging. These materials include polystyrene, polyvinyl chloride, polyester, polycarbonate, polypropylene, and other polymeric films, as well as cellulosic-type materials, including paper, and paper board. It will be appreciated, however, that other dielectric substrate materials may be used without departing from the spirit of the present invention, so long as the substrate has suitable dielectric properties, and so long as the substrate is capable of receiving ink applied using an ink printing process. It will be further appreciated that it would be possible to enhance the dielectric properties of a particular substrate by applying dielectric layers onto the substrate, as needed, prior to the printing of the EAS tag components. Such dielectric layers may be applied using printing, coating, or other suitable techniques.

Figure 8A:
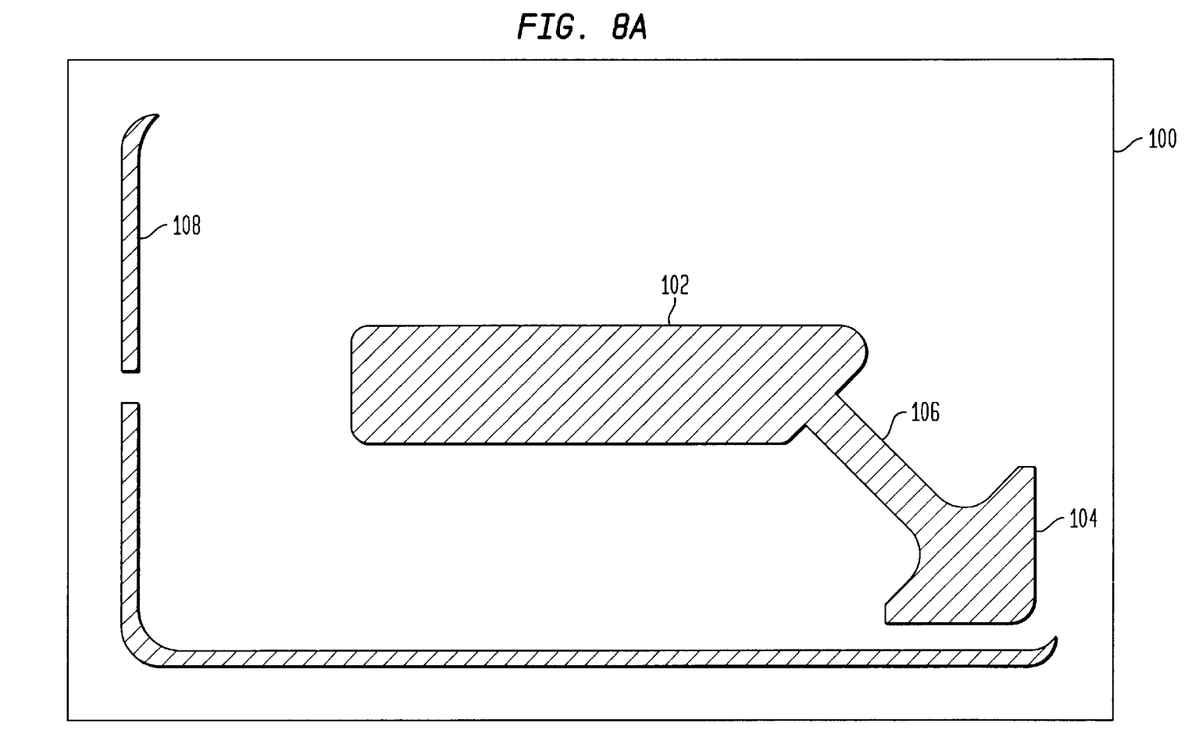

FIG. 8A shows a top view and FIG. 8B shows a side view of the dielectric substrate 100 shown in FIGS. 7A and 7B. A first circuit component layer has been fabricated onto the substrate. According to a further aspect of the invention, the first circuit component layer may be fabricated onto the substrate 100 using a high-speed printing technique to apply a conductive ink onto the substrate.

A flexible, elastomeric, conductive ink composition is suitable for use in accordance with this aspect of the invention. The ink composition preferably comprises a polymeric binder and finely divided particles of silver, aluminum, nickel, or carbonaceous materials that are interspersed in the binder in an amount from approximately 15 to 90 percent by weight, based upon the weight of the composition, the metal particles having a size in the range from approximately 0.05 to 40 microns.

One conductive ink that is suitable for this application comprises −325 mesh (or 44 micron) silver particles combined with polymeric binders. Other particles that may be used include nickel and aluminum. In addition, metal-coated particles may be used, including silver-coated copper or silver-coated glass. A high loading of graphite may also be considered. Alternatively, a conventional solvent conductive ink may be used, with finely divided metals. Examples of such inks include Acheson 725A, Acheson 479SS, Acheson PF-407C, Dupont CB028 and Dupont 5007.

According to a further aspect of the invention, a screen technique is used to print the desired pattern on a polymeric substrate. The screen may be created in any number of ways known in the art. In one approach, the screen comprises a fine porous mesh that is covered with a non-porous, photosensitive material. The desired circuit pattern is then transferred photographically onto the photosensitive material. The non-porous coating is then chemically washed away with respect to those portions of the screen through which conductive ink is to be printed onto the substrate.

Once the screen has been prepared, the screen is loaded into a suitable printing press. The substrate is then fed through the press, and conductive ink is forced through the screen onto the substrate. Techniques have been developed to print both sides of a substrate simultaneously, if desired. After the ink has been printed onto the substrate, it is then cured using a suitable curing technique. The technique used to cure the ink depends on a number of factors including, for example, whether the ink is water-based or solvent-based and, if the ink is solvent-based, what particular solvent or solvents are used. According to one currently used curing technique, the ink used for printing has a photo-initiator mixed in. After the ink has been printed, it is exposed to ultraviolet (UV) radiation in a curing station, where the photo-initiator causes the ink to cure. In another curing technique, the printed ink is exposed to an electron beam to induce polymerization. Where an electron beam is used to cure the ink, the photo-initiator is unnecessary. It will be appreciated that the scope of the present invention is not limited by the particular curing technique that is used.

It will be seen that the pattern of circuit components 104–108 fabricated onto the substrate 100 in FIGS. 8A and 8B is essentially a mirror image of the pattern of circuit components illustrated in FIG. 2. The circuit pattern includes a central electrode 102 and a triangular connector 104, connected by a conductive pathway 106. Also, a broken L-shaped member 108 is provided for electromagnetic shielding. It should be noted, however, that other arrangements of circuit components may be used without departing from the spirit of the invention, and it is not intended the scope of the claims be limited to the arrangements of circuit components illustrated and described herein.

Figure 9A:
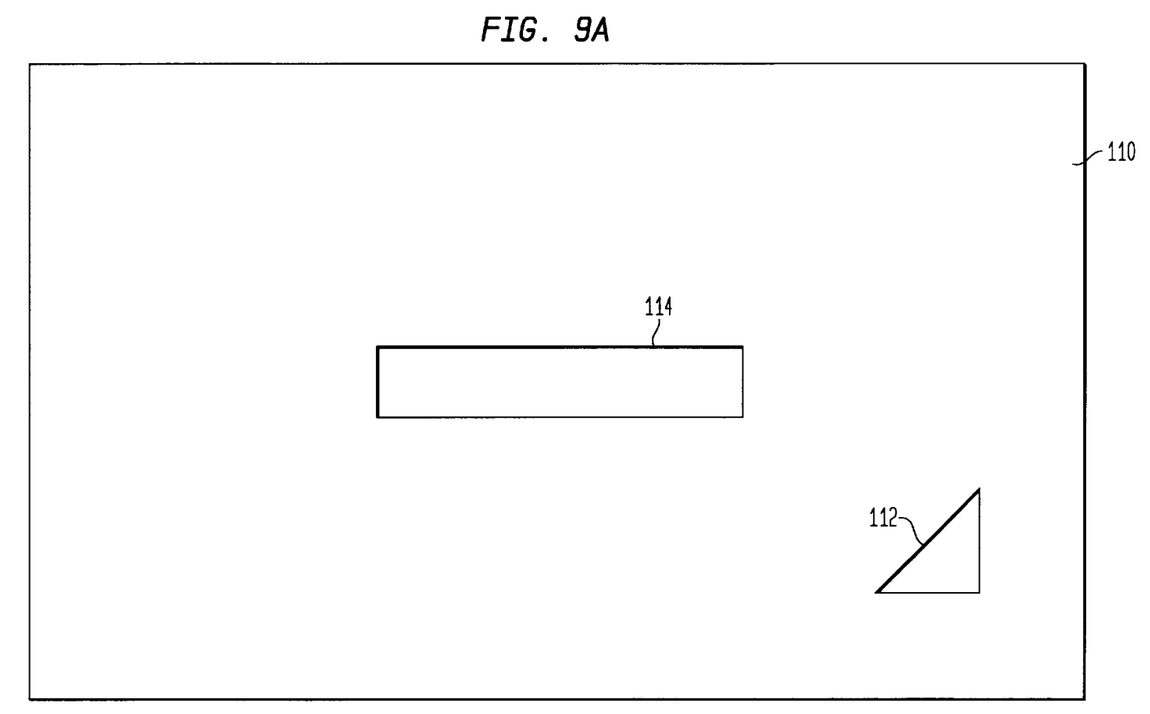
FIGS. 9A and 9B show, respectively, top and front elevation views of the dielectric substrate shown in FIGS. 8A and 8B, with a dielectric layer fabricated on top of the first circuit component layer.
Figure 9B:
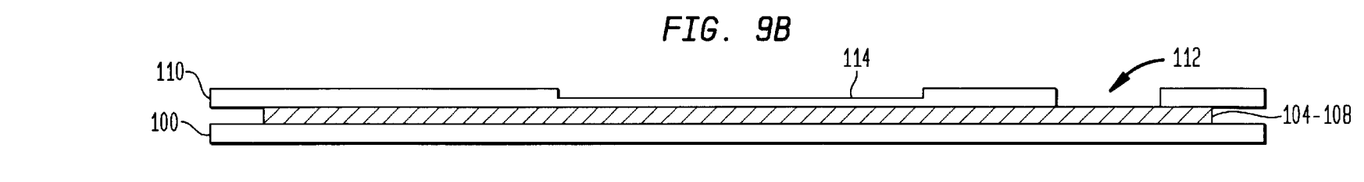

FIG. 9A shows a top view and FIG. 9B shows a side view of the next phase of the fabrication process, in which a layer of dielectric material 110 has been printed, or otherwise fabricated, on top of the circuit components 104–108 shown in FIGS. 8A and 8B. As shown in FIG. 9A, the layer of dielectric material 110 includes a triangular opening 112 in the lower right corner, corresponding in position to the connector 104 shown in FIG. 8A.

Further, the layer of dielectric material includes a membrane 114, which is formed by printing, or otherwise fabricating, a smaller amount of dielectric material 110 in a desired position. Using printing techniques, it is possible to control the thickness of the membrane 114 with great precision. Therefore, it is possible to create a membrane 114 that is thick enough to provide desired insulation between layers of circuit components, while at the same time being thin enough such that the membrane will fail when exposed to an electrical field of sufficient strength.

Figure 10A:
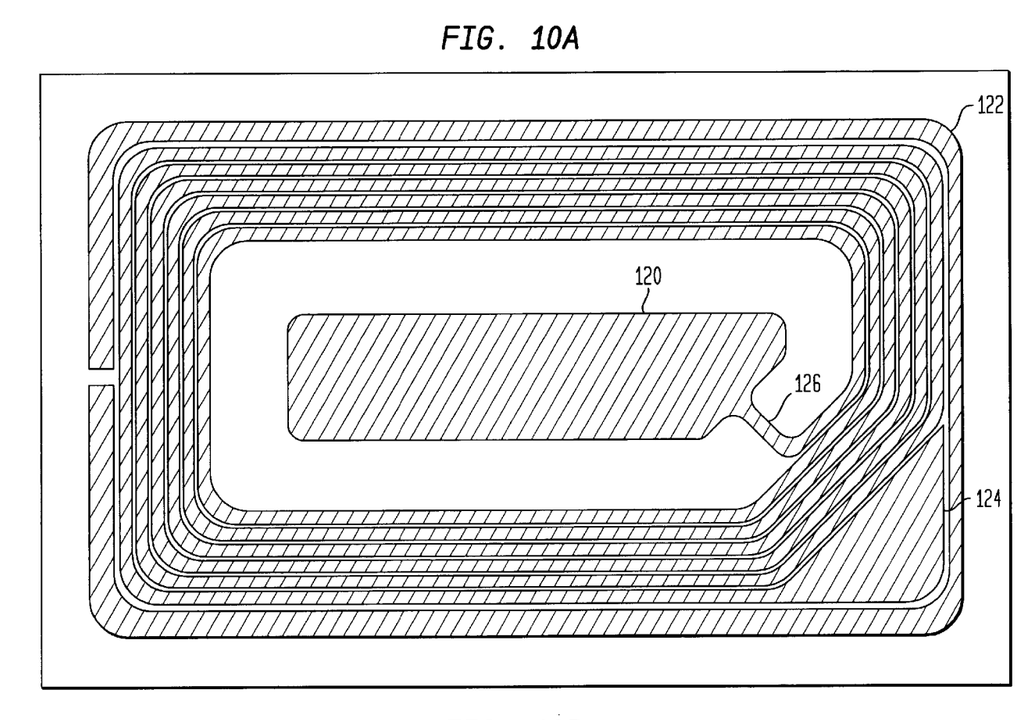
FIGS. 10A and 10B show, respectively, top and front elevation views of the dielectric substrate shown in FIGS. 9A and 9B, with a second circuit component layer printed on top of the dielectric layer.
Figure 10B:
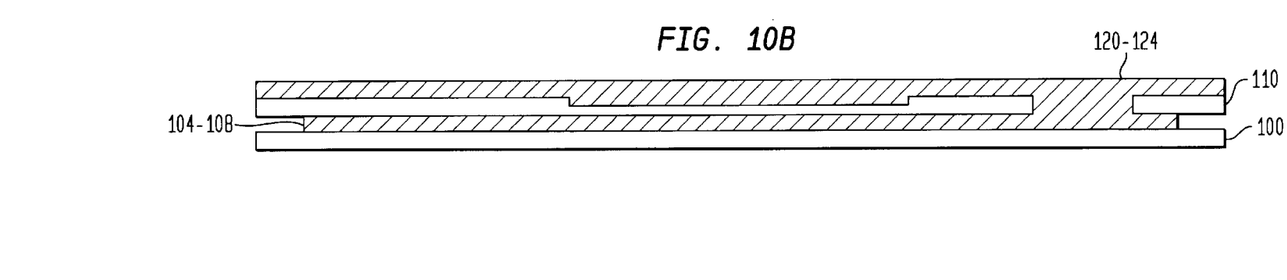

FIG. 10A shows a top view and FIG. 10B shows a side view of the next step in the process, in which a second layer of components 120–124 has been printed, or otherwise fabricated, on top of the dielectric layer shown in FIGS. 9A and 9B. The circuit components shown in FIGS. 110A and 10B are substantially similar to the components shown in FIG. 1. They include a central electrode 120, an inductor 122, a connector 124, and a conductive pathway 126 between the electrode 120 and the connector 124. It will be seen that the central electrode 120 lines up with the electrode 102 shown in FIGS. 8A and 8B. Thus these two electrodes 102, 120, when spaced apart from each other at a suitable distance and separated by a suitable dielectric, function as a capacitor. It will further be seen that the triangular connector 124 lines up with the connector 104 shown in FIG. 8A.

Once the top layer of circuit components 120–124 has been printed, the EAS tag is then finished. This finishing can be done, for example, by printing an insulative layer of dielectric material over the top layer of circuit components 120–124. It should be noted that the EAS tag illustrated in FIGS. 7 through 10B can be printed directly onto a retail package, or even directly onto a suitable surface of the retail item itself. Otherwise, the EAS tag may be printed onto a substrate that can be provided with an adhesive backing for affixing the tag onto a retail package or item.

Figure 11:
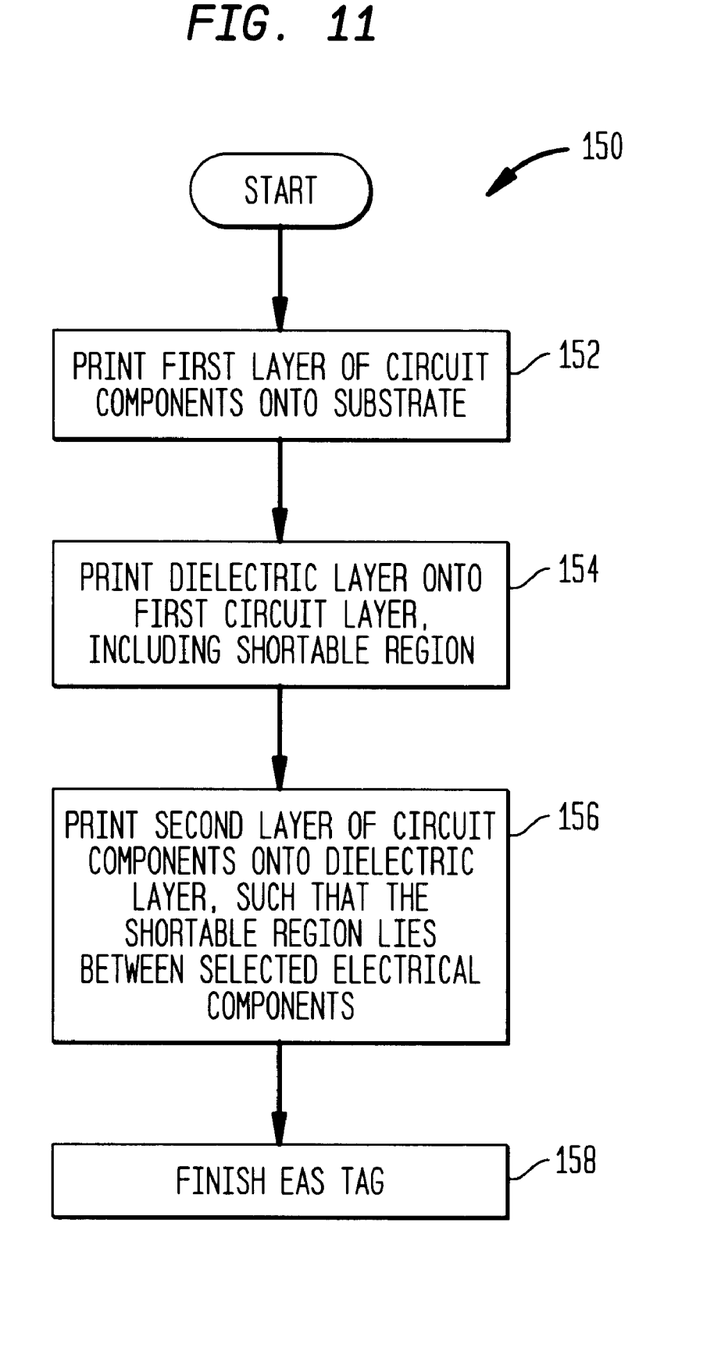
FIG. 11 shows a flowchart of a method according to a further aspect of the invention.

FIG. 11 shows a flowchart of a method 150 according to a further aspect of the invention. In step 152, a first layer of circuit components is printed onto a dielectric substrate. In step 154, a layer of dielectric material is printed onto the first component layer. The dielectric layer includes a membrane, as described above. In addition, the dielectric layer may include openings that leave one or more regions of a circuit component layer exposed to make electric contact with a subsequently printed circuit component layer. In step 156, a second circuit component layer is printed onto the dielectric layer, such that the membrane lies between selected electrical components. In step 158, the EAS tag is finished. The finishing process can include applying a protective layer on top of the tag, or printing graphic or text on top of the tag to conceal it, both for security and for esthetic reasons.

Figure 12:
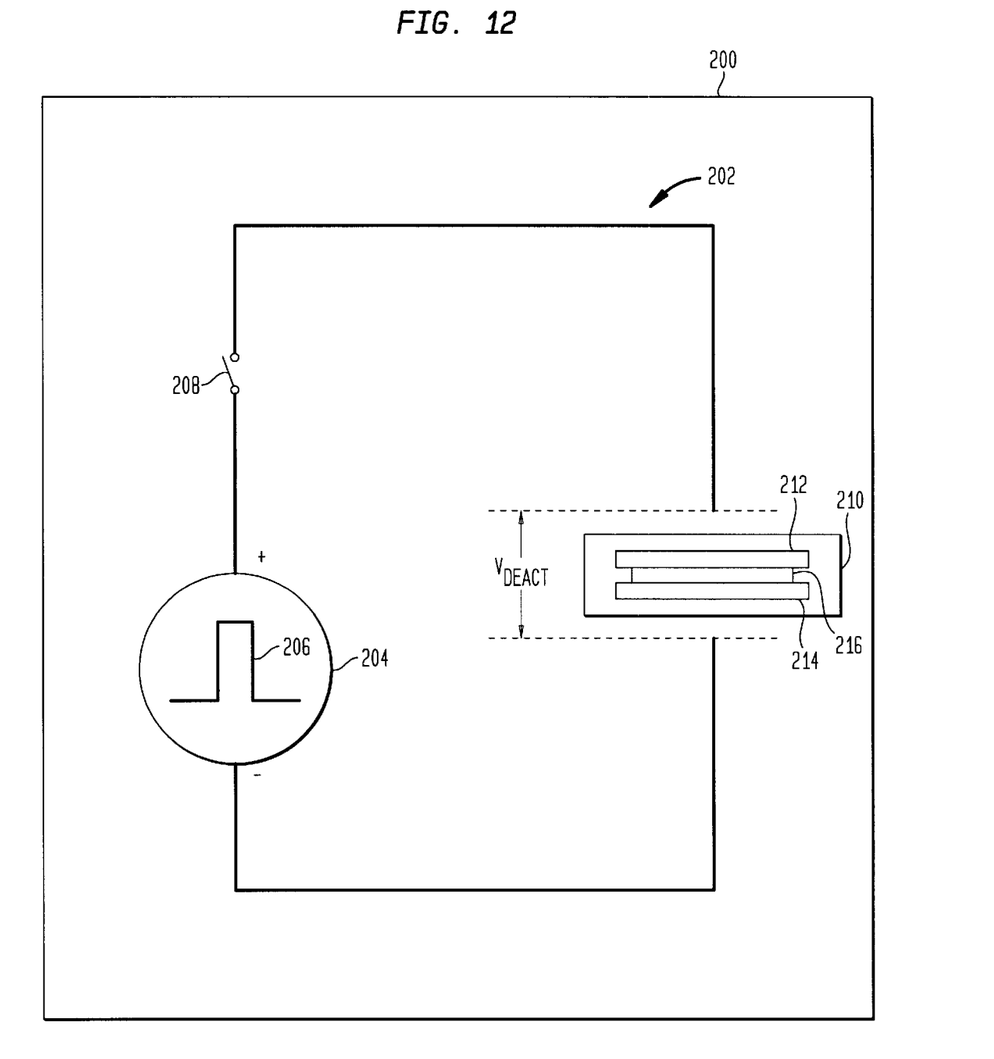
FIG. 12 shows a diagram of an EAS tag deactivation fixture according to a further aspect of the invention.

As described above, an EAS tag according to the invention is deactivated by applying a deactivation voltage across the tag. FIG. 12 shows a diagram of a deactivation fixture 200 that can be used to apply the deactivation voltage. As shown in FIG. 12, the fixture 200 includes a deactivation circuit 202 having a voltage source 204 that selectably generates a pulse voltage 206, and a switch 208 for selectably connecting the voltage source 204 into the deactivation circuit 202.

As shown in FIG. 12, the deactivation circuit 202 is used to selectably apply a deactivation voltage $V_{DEACT}$ across an EAS tag 210 that has properly been positioned within the fixture 200. The EAS tag includes first and second electrical components 212 and 214 that are separated by a membrane 216. In deactivating the EAS tag 210, switch 208 is closed, and a pulse voltage is generated by the voltage source 204. The voltage pulse 206 is timed to be of sufficient duration to cause the membrane 216 to fail, thereby deactivating the EAS tag.

While the foregoing description includes details which will enable those skilled in the art to practice the invention, it should be recognized that the description is illustrative in nature and that many modifications and variations thereof will be apparent to those skilled in the art having the benefit of these teachings. It is accordingly intended that the invention herein be defined solely by the claims appended hereto and that the claims be interpreted as broadly as permitted by the prior art.

We claim:

1. An electronic article surveillance tag, comprising:
a dielectric substrate having upper and lower surfaces; and
a resonant circuit having circuit components fabricated from a printed conductive ink onto the upper and lower surfaces of the dielectric substrate, the resonant circuit being tuned to be detectable by a sensor;
the dielectric substrate including an acid-etched membrane that provides insulation between a first circuit component fabricated onto the upper surface of the dielectric substrate and a second circuit component fabricated onto the lower surface of the dielectric substrate;
the membrane failing when a deactivation voltage is applied across the electronic article surveillance tag, causing the resonant circuit to become detuned.

2. The electronic article surveillance tag of claim 1, wherein the resonant circuit includes a first connector fabricated onto the upper surface of the dielectric substrate that makes electrical contact with a second connector fabricated onto the lower surface of the dielectric substrate.

3. The electronic article surveillance tag of claim 2, wherein portions of the first connector extend through the dielectric substrate to make electrical contact with the second connector.

4. The electronic article surveillance tag of claim 2, wherein the dielectric substrate includes an opening therein through which the first connector makes electrical contact with the second connector.

5. The electronic article surveillance tag of claim 1, wherein the resonant circuit includes a capacitor, and wherein the first and second circuit components are capacitor electrodes.

6. The electronic article surveillance tag of claim 1, wherein the membrane is formed by using a high-speed printing technique to apply an acid solution to the dielectric substrate.

7. The electronic article surveillance tag of claim 6, wherein a serigraphic printing technique is used to apply the acid solution to the dielectric substrate.

8. An electronic article surveillance tag, comprising:
a dielectric substrate having upper and lower surfaces; and
a first electrode and an inductor fabricated from a printed conductive ink onto the upper surface of the dielectric substrate and a second electrode fabricated from a printed conductive ink onto lower surface of the dielectric substrate, the first and second electrodes being positioned with respect to each other to form a capacitor, the inductor and capacitor being connected together to form a resonant circuit that is tuned to be detectable by a sensor,
the dielectric substrate including an acid-etched membrane that provides insulation between the first and second electrodes, the membrane failing when a deactivation voltage is applied across the electronic article surveillance tag, causing the resonant circuit to become detuned.

9. The electronic article surveillance tag of claim 8, wherein the resonant circuit includes a first connector fabricated onto the upper surface of the dielectric substrate that makes electrical contact with a second connector fabricated onto the lower surface of the dielectric substrate.

10. A method for manufacturing an electronic article surveillance tag, comprising:
applying an acid solution to a dielectric substrate having an upper surface and a lower surface;
allowing the acid solution to form a membrane in the dielectric substrate;
washing the acid solution off of the dielectric substrate;
fabricating circuit components from a printed conductive ink onto the upper surface and lower surface of the dielectric substrate, the circuit components forming a resonant circuit that is tuned to be detectable by a sensor, the membrane providing insulation between a first circuit component on the upper surface of the dielectric substrate and a second circuit component on the lower surface of the dielectric substrate, the membrane failing when a deactivation voltage is applied across the electronic article surveillance tag, causing the resonant circuit to become detuned.

11. The method of claim 10, wherein the resonant circuit includes a capacitor, and wherein the first circuit component is a first capacitor electrode and the second circuit component is a second capacitor electrode.

12. A method for manufacturing an electronic article surveillance tag, comprising:
 applying an acid solution to a dielectric substrate having an upper surface and a lower surface;
 allowing the acid solution to form a membrane in the dielectric substrate;
 washing the acid solution off of the dielectric substrate;
 fabricating an inductor and a first electrode from a printed conductive ink onto an upper surface of the dielectric substrate;
 fabricating a second electrode from a printed conductive ink onto a lower surface of the dielectric substrate, the first and second electrodes being positioned with respect to each other to form a capacitor, the inductor and capacitor being connected into a resonant circuit that is tuned to be detectable by a sensor, the membrane providing insulation between the first and second electrodes, the membrane failing when a deactivation voltage is applied across the electronic article surveillance tag, causing the resonant circuit to become detuned.

13. The method of claim 12, further including:
 fabricating first and second connectors into the resonant circuit, the first connector being fabricated from a printed conductive ink onto the upper surface of the dielectric substrate and the second connector being fabricated from a printed conductive ink onto the lower surface of the dielectric substrate, the first connector making electrical contact with the second connector.

14. An electronic article surveillance tag, comprising:
 a dielectric substrate;
 a first circuit component layer fabricated from a printed conductive ink onto a first side of the dielectric substrate;
 a dielectric layer fabricated from a printed insulative material on top of the first layer of circuit components on the first side of the dielectric substrate;
 a second circuit component layer fabricated from a printed conductive ink onto the dielectric layer on the first side of the dielectric substrate, the first and second circuit component layers forming a resonant circuit that is tuned to be detectable by a sensor;
 the dielectric layer including a print-formed membrane that provides insulation between a first circuit component in the first circuit component layer and a second circuit component in the second circuit component layer, the membrane failing when a deactivation voltage is applied across the electronic article surveillance tag, causing the resonant circuit to become detuned.

15. The electronic article surveillance tag of claim 14, wherein the first and second circuit components are capacitor electrodes.

16. The electronic article surveillance tag of claim 14, wherein the dielectric layer includes an opening therein through which a connector in the first circuit component layer makes electrical contact with a connector in the second circuit component layer.

17. The electronic article surveillance tag of claim 14, wherein the first circuit component layer, the dielectric layer, and the second circuit component layer are fabricated using a high-speed printing technique.

18. An electronic article surveillance tag, comprising:
 a dielectric substrate;
 a first circuit component layer, including a first electrode, fabricated from a printed conductive ink onto a first side of the dielectric substrate;
 a dielectric layer fabricated from a printed insulative material on top of the first circuit component layer on the first side of the dielectric substrate;
 a second circuit component layer fabricated from a printed conductive ink on top of the dielectric layer on the first side of the dielectric substrate, the second circuit component layer including an inductor and a second electrode, the first electrode and the second electrode being positioned with respect to each other to form a capacitor, the inductor and the capacitor being connected into a resonant circuit that is tuned to be detectable by a sensor;
 the dielectric layer including a print-formed membrane that provides insulation between the first and second electrodes, the membrane failing when a deactivation voltage is applied across the electronic article surveillance tag, causing the resonant circuit to become detuned.

19. The electronic article surveillance tag of claim 18, wherein the dielectric layer includes an opening therein through which a connector in the first circuit component layer makes electrical contact with a connector in the second circuit component layer.

20. The electronic article surveillance tag of claim 18, wherein the first circuit component layer, the dielectric layer, and the second circuit component layer are fabricated using a high-speed printing technique.

21. A method for manufacturing an electronic article surveillance tag, comprising:
 fabricating a first circuit component layer from a printed conductive ink onto a first side of a dielectric substrate;
 fabricating a dielectric layer from a printed insulative material on top of the first circuit component layer on the first side of the substrate;
 fabricating a second circuit component layer from a printed conductive ink onto the dielectric layer on the first side of the substrate, the first and second circuit component layers forming a resonant circuit that is tuned to be detectable by a sensor, the dielectric layer including a print-formed membrane that provides insulation between a first circuit component in the first circuit component layer and a second circuit component in the second circuit component layer, the membrane failing when a deactivation voltage is applied across the electronic article surveillance tag, causing the resonant circuit to become detuned.

22. The method of claim 21, wherein the first and second circuit components are capacitor electrodes.

23. The method of claim 21, wherein the step of fabricating a dielectric layer including fabricating an opening in the dielectric layer through which a connector in the first circuit component layer makes electrical contact with a connector in the second circuit component layer.

24. The method of claim 21, wherein the first circuit component layer, the dielectric layer, and the second circuit component layer are fabricated using a high-speed printing technique.

25. A method for manufacturing an electronic article surveillance tag, comprising:

fabricating a first circuit component layer from a printed conductive ink onto a first side of a dielectric substrate, the first circuit component layer including a first electrode;

fabricating a dielectric layer from a printed insulative material on top of the first circuit component layer on the first side of the dielectric substrate;

fabricating a second circuit component layer from a printed conductive ink onto the dielectric layer on the first side of the dielectric substrate, the second circuit component layer including an inductor and a second electrode, the first and second electrodes being positioned with respect to each other to form a capacitor, the inductor and the capacitor being connected into a resonant circuit that is tuned to he detectable by a sensor, the dielectric layer including a print-formed membrane that provides insulation between the first and second electrodes, the membrane failing when a deactivation voltage is applied across the electronic article surveillance tag, causing the resonant circuit to become detuned.

26. The electronic article surveillance tag of claim 25, wherein the step of fabricating a dielectric layer includes fabricating an opening in the dielectric layer through which a connector in the first circuit component layer makes electrical contact with a connector in the second circuit component layer.

27. The electronic article surveillance tag of claim 25, wherein the first circuit component layer, the dielectric layer, and the second circuit component layer are fabricated using a high-speed printing technique.

28. A fixture for deactivating an EAS tag, comprising:

a deactivation circuit including a voltage source for selectably generating a pulse voltage and a switch for selectably connecting the voltage source into the deactivation circuit, the deactivation circuit selectably generating a deactivation voltage across an EAS tag positioned in the fixture, the deactivation voltage causing a membrane positioned between two circuit components, fabricated from a conductive ink, in the EAS tag to fail, the failure of the membrane causing the EAS tag to become deactivated.

29. A tag, comprising:

a dielectric substrate having upper and lower surfaces, and a circuit including a first circuit component fabricated from a conductive ink onto the upper surface of the dielectric substrate and a second circuit component fabricated from a conductive ink onto the lower surface of the dielectric substrate opposite the first circuit component, the circuit being tuned to cause a characteristic perturbation in an electromagnetic field, the dielectric substrate including an acid-etched membrane portion between the first and second circuit components, the membrane providing insulation between the first and second circuit components, the membrane failing when a deactivation voltage is applied across the tag.

30. The tag of claim 29, wherein the first and second circuit components are electrodes that together form a capacitor, and wherein the failure of the membrane causes a short circuit to form between the electrodes, thereby disabling the capacitor.

31. The tag of claim 29, wherein the membrane is formed by using a high-speed printing technique to apply an acid solution to the dielectric substrate.

32. The tag of claim 31, wherein a serigraphic printing technique is used to apply the acid solution to the dielectric substrate.

33. A method for manufacturing a tag, comprising:

applying an acid solution to a dielectric substrate having an upper surface and a lower surface;

allowing the acid solution to form a membrane in the dielectric substrate;

washing the acid solution off of the dielectric substrate; and fabricating circuit components from a printed conductive ink onto the upper surface and lower surface of the dielectric substrate, the circuit components forming a circuit that is tuned to cause a characteristic perturbation in an electromagnetic field, the membrane providing insulation between a first circuit component on the upper surface of the dielectric substrate and a second circuit component on the lower surface of the dielectric substrate, the membrane failing when a deactivation voltage is applied across the tag.

34. The method of claim 33, wherein the resonant circuit includes a capacitor, and wherein the first circuit component is a first capacitor electrode and the second circuit component is a second capacitor electrode.

35. A tag, comprising:

a dielectric substrate;

a first circuit component layer fabricated from a printed conductive ink onto a first side of the dielectric substrate;

a dielectric layer fabricated from a printed insulative material on top of the first layer of circuit components on the first side of the dielectric substrate; and a second circuit component layer fabricated from a printed insulative material onto the dielectric layer on the first side of the dielectric substrate, the first and second circuit component layers forming a resonant circuit that is tuned to create a characteristic perturbation in an electromagnetic field;

the dielectric layer including a print-formed membrane that provides insulation between a first circuit component in the first circuit component layer and a second circuit component in the second circuit component layer, the membrane failing when a deactivation voltage is applied across the electronic article surveillance tag.

36. The tag of claim 35, wherein the first and second circuit components are capacitor electrodes.

37. The tag of claim 35, wherein the first circuit component layer, the dielectric layer, and the second circuit component layer are fabricated using a high-speed printing technique.

38. A method for manufacturing a tag, comprising:

fabricating a first circuit component layer from a printed conductive ink onto a first side of a dielectric substrate;

fabricating a dielectric layer from a printed insulative material on top of the first circuit component layer on the first side of the dielectric substrate;

fabricating a second circuit component layer onto the dielectric layer, the first and second circuit component layers forming a circuit that is tuned to cause a characteristic perturbation in an electromagnetic field, the dielectric layer including a membrane that provides insulation between a first circuit component in the first circuit component layer and a second circuit component in the second circuit component layer, the membrane failing when a deactivation voltage is applied across the electronic article surveillance tag.

39. The method of claim 38, wherein the first and second circuit components are capacitor electrodes.

40. The method of claim 38, wherein the first circuit component layer, the dielectric layer, and the second circuit component layer are fabricated using a high-speed printing technique.

41. A method for fabricating a resonant tag, comprising:
 (a) fabricating a first layer of circuit components onto a first side of a dielectric substrate by using a high-speed printing technique to apply a conductive ink to the first side of the dielectric substrate;
 (b) using a high-speed printing technique to fabricate an insulative layer over the first layer of resonant circuit components on the first side of the dielectric substrate;
 (c) in step (b), using the high-speed printing technique to control the thickness of the insulative layer to create a deactivation membrane in the insulative layer;
 (d) using a high-speed printing technique to fabricate a second layer of circuit components from a conductive ink over the first layer of circuit components and the insulative layer on the first side of the dielectric substrate, the first and second layers of circuit components forming a tuned resonant circuit, the deactivation membrane providing insulation between a component in the first layer of circuit components and a component in the second layer of circuit components, the deactivation membrane failing when a deactivation voltage is applied across the tag, causing the resonant circuit to detune.

42. The method of claim 41, wherein the deactivation membrane is positioned between a first capacitor plate in the first layer of circuit components and a second capacitor plate in the second layer of capacitor components.

43. The method of claim 41, wherein the high-speed printing technique is a serigraphic technique.

44. A resonant tag, comprising:
 a first layer of circuit components printed, using a high-speed printing technique, onto a first side of a dielectric substrate using a conductive ink;
 an insulative layer on top of the first layer of circuit components on the first side of the dielectric substrate, the insulative layer including a deactivation membrane, the insulative layer and deactivation membrane being fabricated using a printing technique;
 a second layer of circuit components printed, using a high-speed printing technique, over the first layer of circuit components and the insulative layer on the first side of the dielectric substrate, the first and second layers of circuit components forming a tuned resonant circuit, the deactivation membrane providing insulation between a component in the first layer of circuit components and a component in the second layer of circuit components, the deactivation membrane failing when a deactivation voltage is applied across the tag, causing the resonant circuit to detune.

45. The resonant tag of claim 41, wherein the deactivation membrane is positioned between a first capacitor plate in the first layer of circuit components and a second capacitor plate in the second layer of capacitor components.

* * * * *